US012568653B2

(12) United States Patent
Yang

(10) Patent No.: US 12,568,653 B2
(45) Date of Patent: Mar. 3, 2026

(54) SEMICONDUCTOR DEVICE AND FABRICATION METHOD THEREOF

(71) Applicant: UNITED MICROELECTRONICS CORP., Hsin-Chu City (TW)

(72) Inventor: Po-Yu Yang, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 657 days.

(21) Appl. No.: 17/981,504

(22) Filed: Nov. 7, 2022

(65) Prior Publication Data

US 2024/0120398 A1     Apr. 11, 2024

(30) Foreign Application Priority Data

Oct. 11, 2022     (CN) .......................... 202211241895.9

(51) Int. Cl.
| | |
|---|---|
| *H01L 29/423* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01);

*H10D 64/017* (2025.01); *H10D 84/0167* (2025.01); *H10D 84/0172* (2025.01); *H10D 84/0186* (2025.01); *H10D 84/038* (2025.01); *H10D 84/85* (2025.01)

(58) Field of Classification Search
CPC .. H10D 30/6735; H10D 30/014; H10D 30/43; H10D 30/6757; H10D 62/121; H10D 64/017; H10D 84/0167; H10D 84/017; H10D 84/0186; H10D 84/038; H10D 84/85; H10D 84/0188; H10D 84/0193; H10D 84/853
See application file for complete search history.

(56) References Cited

U.S. PATENT DOCUMENTS

| | | | |
|---|---|---|---|
| 9,997,463 B2 | 6/2018 | Zhang | |
| 10,714,585 B2 | 7/2020 | Zhou | |
| 11,164,942 B1 | 11/2021 | Weekx | |
| 2023/0178559 A1* | 6/2023 | Xie | ................... H10D 30/6757 |
| | | | 257/288 |

* cited by examiner

*Primary Examiner* — Cuong B Nguyen
(74) *Attorney, Agent, or Firm* — Winston Hsu

(57) ABSTRACT

The invention discloses a semiconductor device comprising a first transistor and a second transistor, wherein the first transistor and the first transistor are separated by an air gap. The first transistor includes a first fin structure including a first source, a first drain, and a first channel. The second transistor includes a second fin structure including a second source, a second drain, and a second channel.

20 Claims, 9 Drawing Sheets

SEMICONDUCTOR DEVICE AND FABRICATION METHOD THEREOF

BACKGROUND OF THE INVENTION

1. Field of the Invention

The invention relates to the field of semiconductor technology, in particular to a 3D semiconductor transistor device and a manufacturing method thereof.

2. Description of the Prior Art

Gate-all-around, or GAA transistors, are a modified transistor structure where the gate contacts the channel from all sides and enables continued scaling.

GAA devices use vertically-stacked nanosheets. They are constructed of separate horizontal sheets, surrounded by gate materials on all sides. This provides improved channel control relative to finFETs. Unlike finFETs, where higher current requires multiple side-by-side fins, the current-carrying capacity of GAA transistors is increased by stacking a few nanosheets vertically, with gate material wrapped around the channels. The nanosheet dimensions can be scaled so that transistors can be sized for the specific performance required.

However, as with fins, the width and spacing of the sheets will drop as the technology scales and as our ability to print finer features continues to improve. At some point, the width of the sheet may be roughly the same as the thickness—at which point they resemble nanowires.

The GAA transistors are fabricated by first growing a superlattice of alternating Si and SiGe epitaxial layers, which form the basis for the nanosheets. Critical steps include deposition of an inner dielectric spacer to protect the source/drain regions and define the gate width, as well as the channel release etch to remove the sacrificial layers. That space left by removal of the sacrificial layers then needs to be filled with the gate dielectric and metal including between the nanosheets.

SUMMARY OF THE INVENTION

It is one object of the present invention to provide an improved semiconductor device and a manufacturing method thereof to solve the deficiencies or disadvantages of the prior art.

One aspect of the invention provides a semiconductor device including a substrate having a first device region and a second device region adjacent to the first device region; a first transistor disposed in the first device region, the first transistor comprising a first fin structure on the substrate, wherein the first fin structure comprises a first source, a first drain, and a first channel extending between the first source and the first drain in a first direction; and a second transistor disposed in the second device region and spaced apart from the first transistor in a second direction, the second transistor comprising a second fin structure on the substrate. The second fin structure comprises a second source, a second drain, and a second channel extending between the second source and the second drain in the first direction. The first fin structure and the second fin structure are separated one from the other by an air gap. The air gap has a longitudinal axis parallel to the first direction.

According to some embodiments, the air gap is disposed along a boundary between the first device region and the second device region.

According to some embodiments, the first device region is an NMOS region and the first transistor is an NMOS transistor.

According to some embodiments, the second device region is a PMOS region and the second transistor is a PMOS transistor.

According to some embodiments, the first fin structure comprises a first stack of nanosheets, wherein each of the nanosheets is surrounded by a first gate dielectric.

According to some embodiments, the second fin structure comprises a second stack of nanosheets, wherein each of the nanosheets is surrounded by a second gate dielectric.

According to some embodiments, each of the nanosheets is formed of a channel material.

According to some embodiments, an interior surface of the air gap is covered with a lining layer.

According to some embodiments, the lining layer is a silicon oxide layer.

According to some embodiments, the air gap is communicated with a sealed contact hole.

Another aspect of the invention provides a method for forming semiconductor device. A substrate having a first device region and a second device region adjacent to the first device region is provided. A first transistor is formed in the first device region. The first transistor includes a first fin structure on the substrate. The first fin structure includes a first source, a first drain, and a first channel extending between the first source and the first drain in a first direction. A second transistor is formed in the second device region and is spaced apart from the first transistor in a second direction. The second transistor includes a second fin structure on the substrate. The second fin structure includes a second source, a second drain, and a second channel extending between the second source and the second drain in the first direction. An air gap is formed between the first fin structure and the second fin structure. The first fin structure and the second fin structure are separated one from the other by the air gap, and the air gap has a longitudinal axis parallel to the first direction.

According to some embodiments, the air gap is disposed along a boundary between the first device region and the second device region.

According to some embodiments, the first device region is an NMOS region and the first transistor is an NMOS transistor.

According to some embodiments, the second device region is a PMOS region and the second transistor is a PMOS transistor.

According to some embodiments, the first fin structure comprises a first stack of nanosheets, wherein each of the nanosheets is surrounded by a first gate dielectric.

According to some embodiments, the second fin structure comprises a second stack of nanosheets, wherein each of the nanosheets is surrounded by a second gate dielectric.

According to some embodiments, each of the nanosheets is formed of a channel material.

According to some embodiments, an interior surface of the air gap is covered with a lining layer.

According to some embodiments, the lining layer is a silicon oxide layer.

According to some embodiments, the air gap is communicated with a sealed contact hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 to FIG. 15 illustrate a method for fabricating a semiconductor transistor device according to an embodiment of the present invention, wherein FIGS. 4-7 and FIGS. 14-15 are schematic diagrams shown along line II-IF in FIG. 1, FIG. 8 and FIG. 11 are schematic diagrams of the layout of the semiconductor transistor device, FIG. 9 and FIG. 10 are schematic diagrams shown along line I-I' and line II-IF in FIG. 8, respectively, and FIG. 12 and FIG. 13 are schematic diagrams shown along line I-I' and line II-IF in FIG. 11, respectively.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
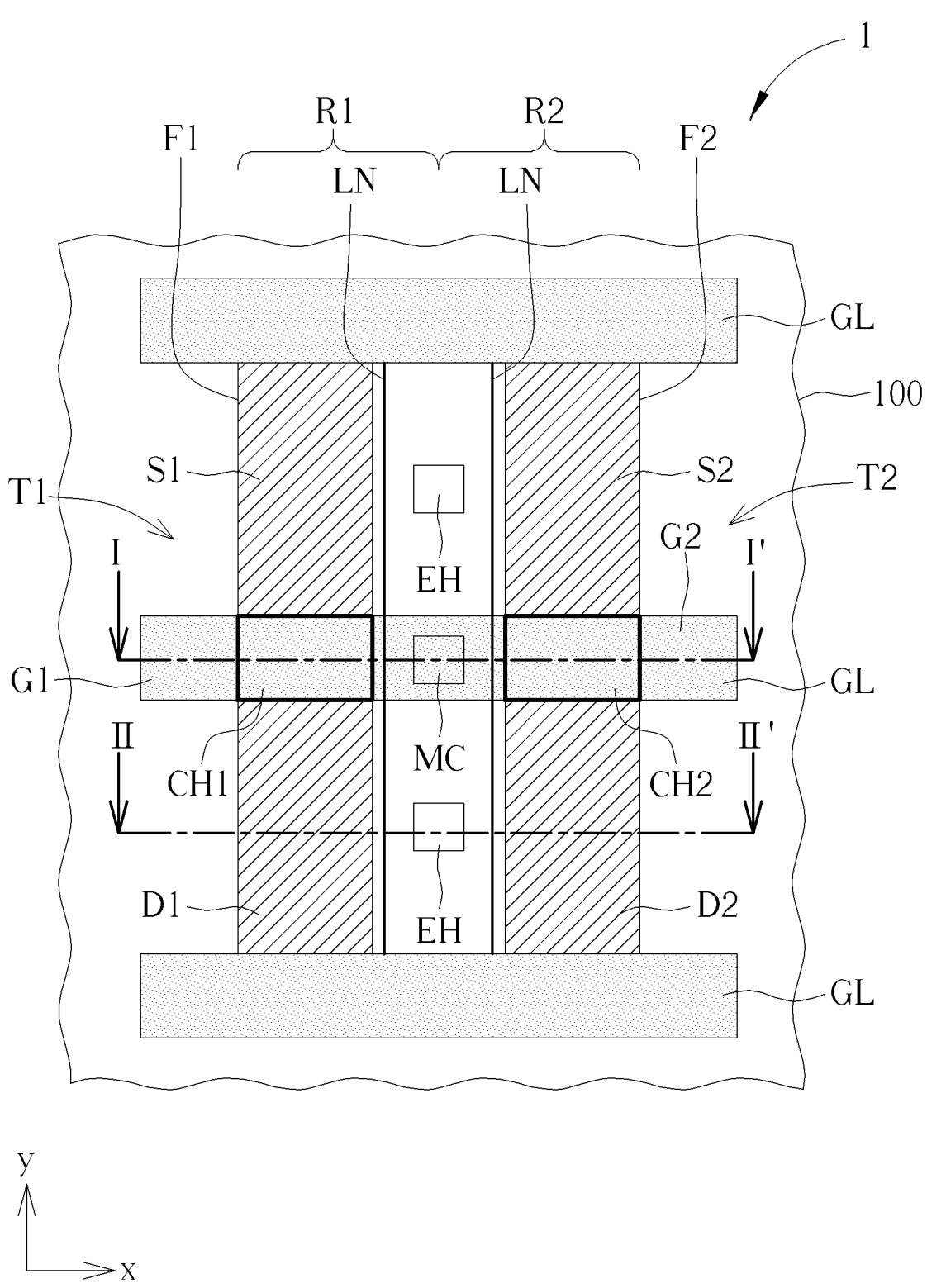
FIG. 1 is a schematic layout diagram of a semiconductor transistor device according to an embodiment of the present invention.
Figure 2:
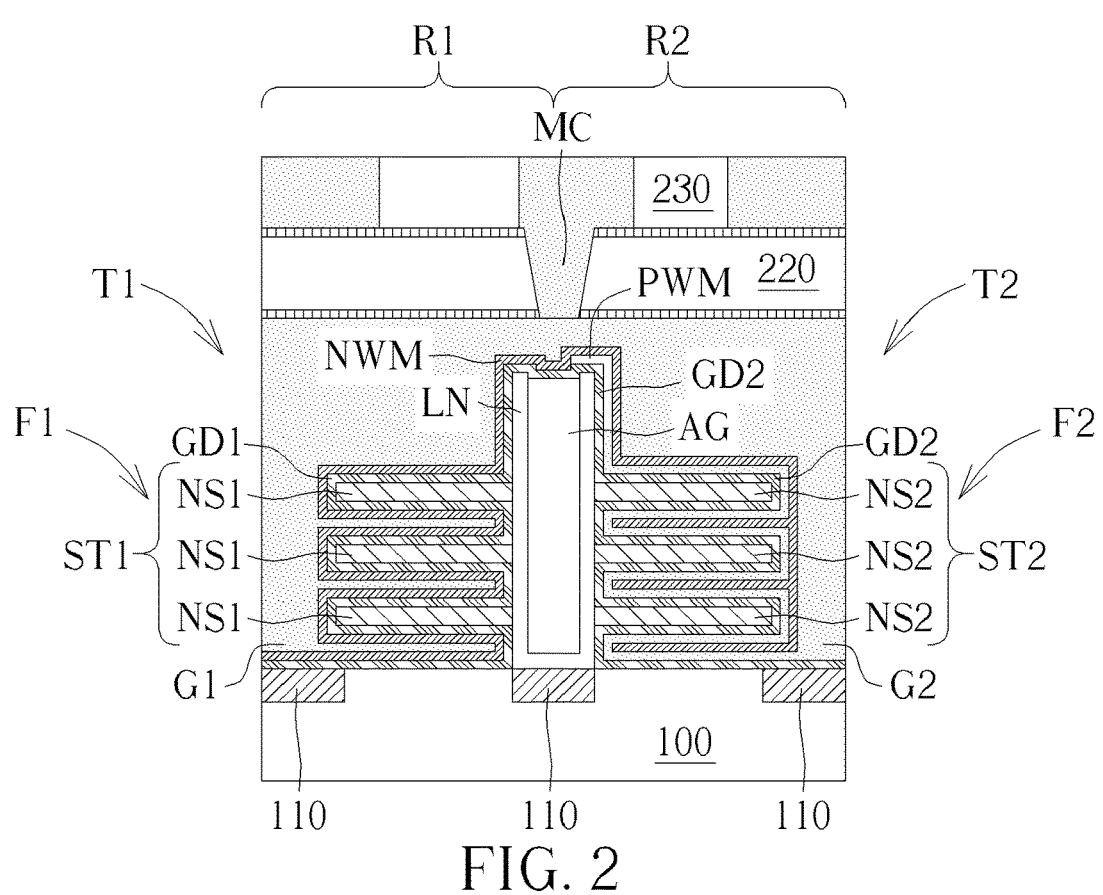
FIG. 2 is a schematic cross-sectional view taken along line I-I' in FIG. 1.
Figure 3:
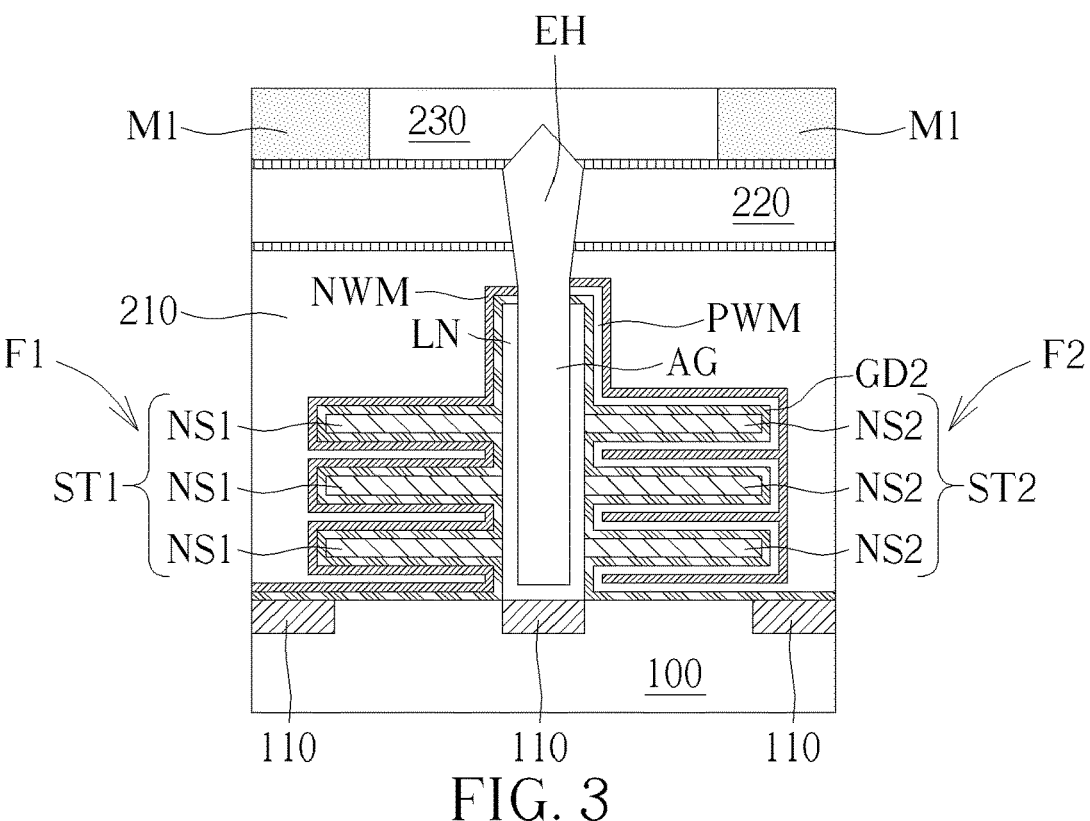
FIG. 3 is a schematic cross-sectional view taken along line II-IF in FIG. 1.

Please refer to FIGS. 1 to 3. FIG. 1 is a schematic layout diagram of a semiconductor transistor device according to an embodiment of the present invention. FIG. 2 is a schematic cross-sectional view taken along line I-I' in FIG. 1. FIG. 3 is a schematic cross-sectional view taken along line II-IF in FIG. 1. As shown in FIGS. 1 to 3, the semiconductor transistor device 1 includes a substrate 100, for example, a silicon substrate, having a first device region R1 and a second device region R2 adjacent to the first device region R1. According to an embodiment of the present invention, an isolation structure 110 is formed in the substrate 100. According to an embodiment of the present invention, a first transistor T1 is provided in the first device region R1, and a second transistor T2 is provided in the second device region R2.

According to an embodiment of the present invention, the first device region R1 is, for example, an NMOS region, and the second device region R2 is, for example, a PMOS region. According to an embodiment of the present invention, the first transistor T1 is, for example, an NMOS transistor, and the second transistor T2 is, for example, a PMOS transistor.

According to an embodiment of the present invention, the first transistor T1 includes a first fin structure F1 on the substrate 100, wherein the first fin structure F1 includes a first source S1, a first drain D1, and a first channel CH1 extending along a first direction (for example, the reference y-axis) between the first source S1 and the first drain D1. According to an embodiment of the present invention, the first transistor T1 further includes a gate G1 extending along a second direction (for example, the reference x-axis), covering the first fin structure F1.

According to an embodiment of the present invention, the second transistor T2 includes a second fin structure F2 on the substrate 100, wherein the second fin structure T2 includes a second source S2, a second drain D2, and a second channel CH2 extending along the first direction (for example, the reference y-axis) between the second source S2 and the second drain D2. According to an embodiment of the present invention, the second transistor T2 further includes a gate G2 extending along the second direction (for example, the reference x-axis), covering the second fin structure F2. According to an embodiment of the present invention, the gate G1 and the gate G2 may be metal gates. For example, the gate G1 and the gate G2 may comprise tungsten.

As shown in FIG. 3, in regions other than the gate G1 and the gate G2, the first transistor T1 and the second transistor T2 are covered by the first interlayer dielectric layer 210. According to an embodiment of the present invention, the top surfaces of the gates G1 and G2 may be flush with the top surface of the first interlayer dielectric layer 210.

According to an embodiment of the present invention, the first transistor T1 is spaced apart from the first transistor T1 in the second direction (for example, the reference x-axis). According to an embodiment of the present invention, the first fin structure F1 of the first transistor T1 and the second fin structure F2 of the second transistor T2 are separated by an air gap AG, and the longitudinal axis of the air gap AG is parallel to the first direction (for example, the reference y-axis).

According to an embodiment of the present invention, the air gap AG is disposed along a boundary (or a PN boundary) between the first device region R1 and the second device region R2. According to an embodiment of the present invention, the extending direction of the air gap AG and the extending directions of the gate G1 and the gate G2 are perpendicular to each other. According to an embodiment of the present invention, as shown in FIG. 2 and FIG. 3, the interior surface of the air gap AG is covered with a lining layer LN. According to an embodiment of the present invention, the lining layer LN may be, for example, a silicon oxide layer.

According to an embodiment of the present invention, as shown in FIG. 2 and FIG. 3, the first fin structure F1 includes a first stack ST1 of a plurality of nanosheets NS1, wherein each of the plurality of nanosheets NS1 is surrounded by a first gate dielectric GD1. According to an embodiment of the invention, the second fin structure F2 includes a second stack ST2 of a plurality of nanosheets NS2, wherein each of the plurality of nanosheets NS2 is surrounded by a second gate dielectric GD2.

According to an embodiment of the present invention, the first gate dielectric GD1 and the second gate dielectric GD2 may be high-k dielectric materials such as hafnium oxide ($HfO_2$), but not limited thereto. According to an embodiment of the present invention, each of the plurality of nanosheets NS1, NS2 may be formed of a channel material, for example, silicon. According to an embodiment of the present invention, a work function layer may be formed on the first gate dielectric GD1 and the second gate dielectric GD2. For example, a P work function layer PWM may be formed on the second gate dielectric GD2 in the second device region R2. An N work function layer NWM may be formed on the first gate dielectric GD1 in the first device region R1 and on the P work function layer PWM in the second device region R2.

According to an embodiment of the present invention, the first interlayer dielectric layer 210 and the gates G1 and G2 are covered with a second interlayer dielectric layer 220, and the second interlayer dielectric layer 220 is covered with a third interlayer dielectric layer 230. According to an embodiment of the present invention, a first metal wiring pattern M1 is formed in the third interlayer dielectric layer 230. According to an embodiment of the present invention, metal contacts MC may be formed over the gate G1 and the gate G2 in the second interlayer dielectric layer 220.

According to an embodiment of the present invention, a contact hole EH is additionally provided above the air gap AG between two adjacent gate lines GL in the second interlayer dielectric layer 220. According to an embodiment of the present invention, the upper end of the contact hole EH is sealed by the third interlayer dielectric layer 230. According to an embodiment of the present invention, the air gap AG communicates with the sealed contact hole EH. The air gap AG can effectively reduce the parasitic capacitance and signal coupling between the first transistor T1 and the second transistor T2, so as to improve the operation performance of the device.

Figure 4:
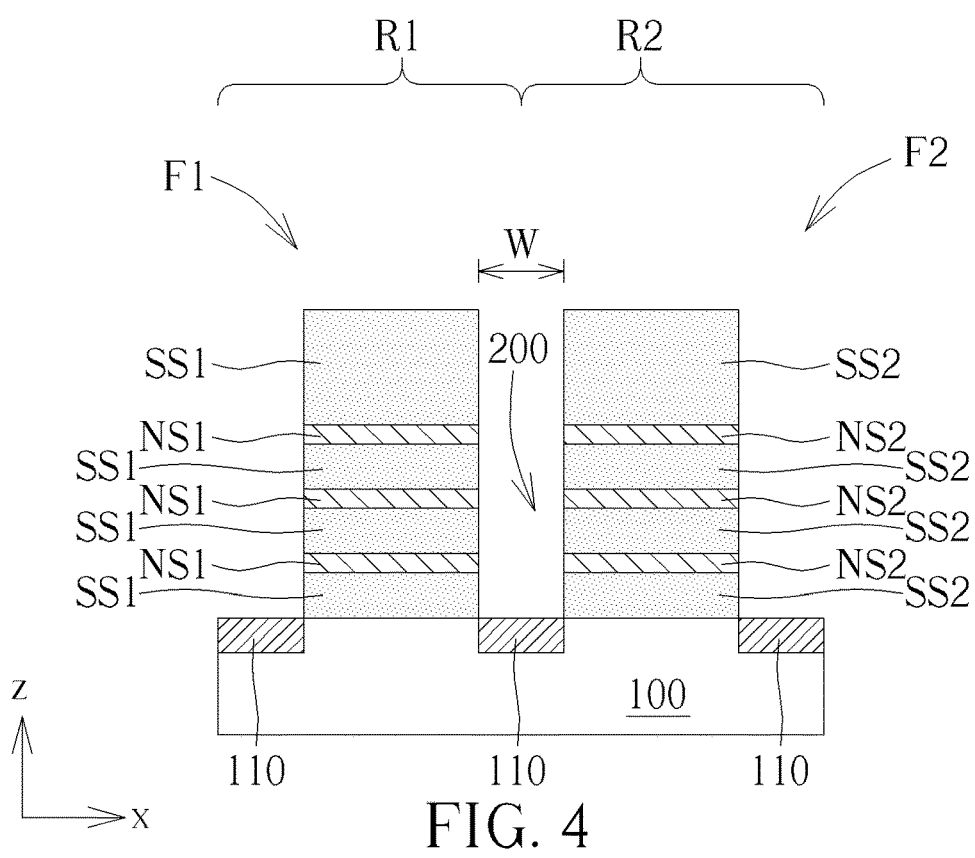

Please refer to FIG. 4 to FIG. 15, which illustrate a method for fabricating a semiconductor transistor device according to an embodiment of the present invention, wherein FIG. 4 to FIG. 7 are schematic diagrams shown along line II-IF in FIG. 1. As shown in FIG. 4, a substrate 100 having a first device region R1 and a second device region R2 adjacent to the first device region R1 is first provided. According to an embodiment of the present invention, an isolation structure 110 is formed in the substrate 100. A first fin structure F1 is formed in the first device region R1, and a second fin structure F2 is formed in the second device region R2.

According to an embodiment of the present invention, the first fin structure F1 is composed of alternately laminated nanosheets NS1 and SiGe epitaxial layers SS1, and the second fin structure F2 is composed of alternately laminated nanosheets NS2 and SiGe epitaxial layers SS2. According to embodiments of the present invention, the nanosheets NS1, NS2 may be formed of a channel material, for example, silicon. A trench 200 with a width w of about 5-20 nanometers is formed at the boundary between the first device region R1 and the second device region R2.

Figure 5:
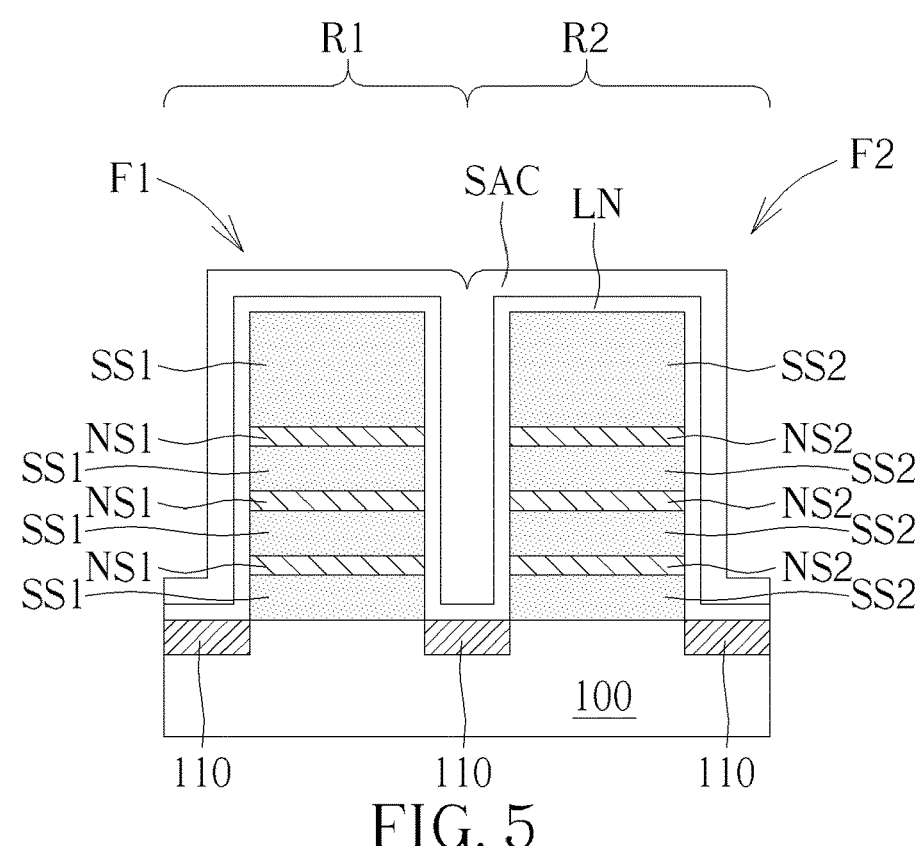

As shown in FIG. 5, subsequently, a lining layer LN and a sacrificial layer SAC are deposited in a blanket manner by a chemical vapor deposition (CVD) process in the first device region R1 and the second device region R2 on the substrate 100. According to an embodiment of the present invention, the lining layer LN may be, for example, a silicon oxide layer. According to an embodiment of the present invention, the sacrificial layer SAC may be, for example, a silicon nitride layer. At this point, the trench 200 between the first device region R1 and the second device region R2 is filled with the lining layer LN and the sacrificial layer SAC.

Figure 6:
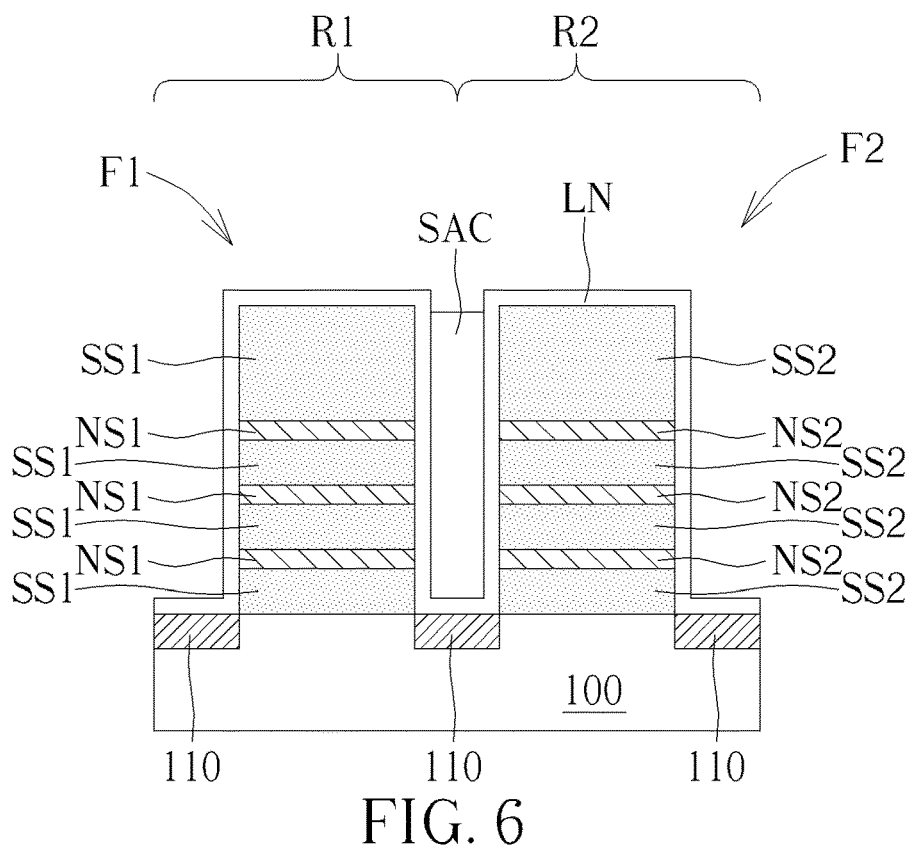

As shown in FIG. 6, next, an anisotropic dry etching process is performed to etch the sacrificial layer SAC on the lining layer LN. According to an embodiment of the present invention, the sacrificial layer SAC filled in the trench 200 between the first device region R1 and the second device region R2 is not removed.

Figure 7:
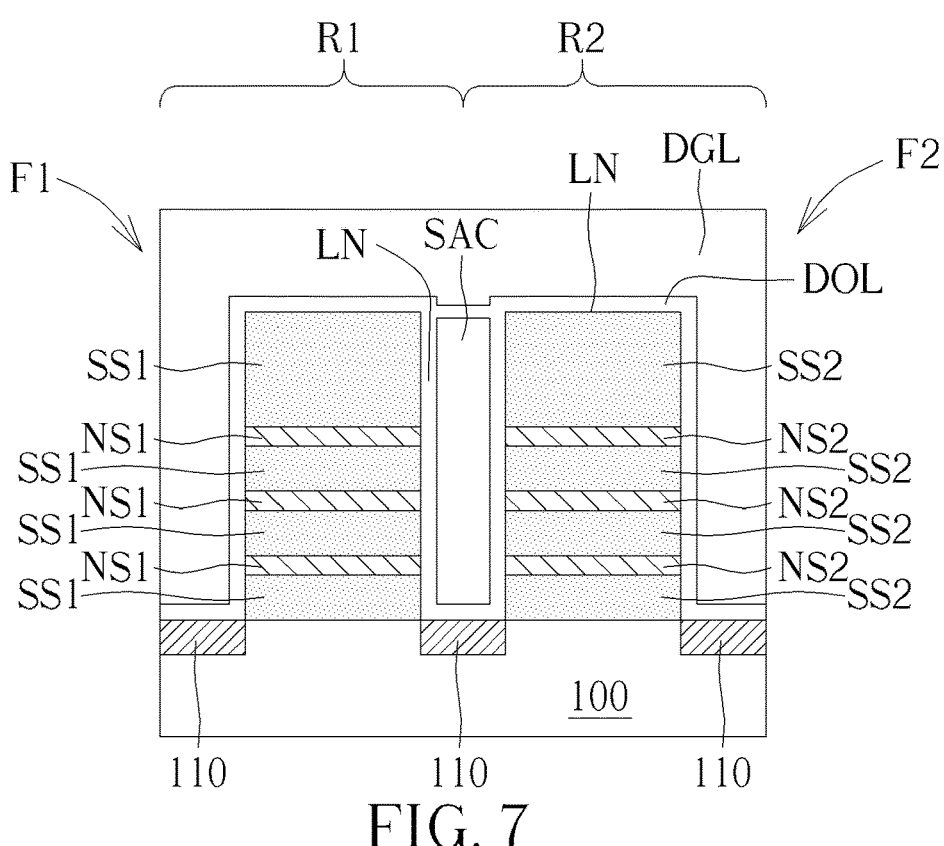

As shown in FIG. 7, a dummy silicon oxide layer DOL is conformally deposited on the lining layer LN and the sacrificial layer SAC in the first and second device regions R1 and R2. A dummy gate layer DGL is then deposited on the dummy silicon oxide layer DOL. According to an embodiment of the present invention, for example, the dummy gate layer DGL may be a polysilicon layer or an amorphous silicon layer.

Subsequent process steps for making transistors can be performed, including, but not limited to, gate patterning, formation of inner spacers, etching of sacrificial layer SAC, epitaxy of source and drain, first interlayer dielectric layer deposition, planarization process, and replacement metal gate (RMG) process. The above steps are all well-known processes, and will not be described in detail.

Figure 8:
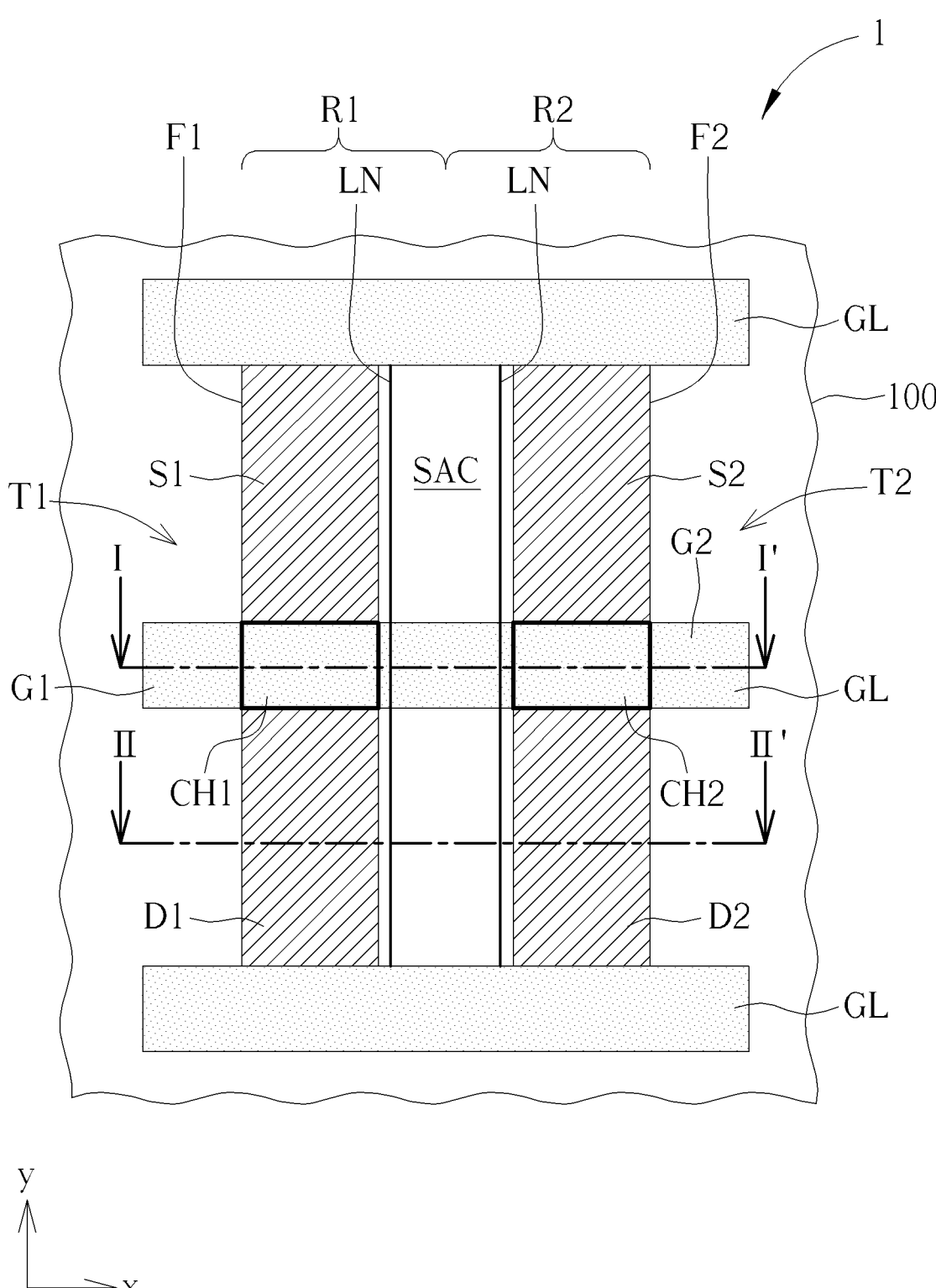
Figure 9:
Figure 9:
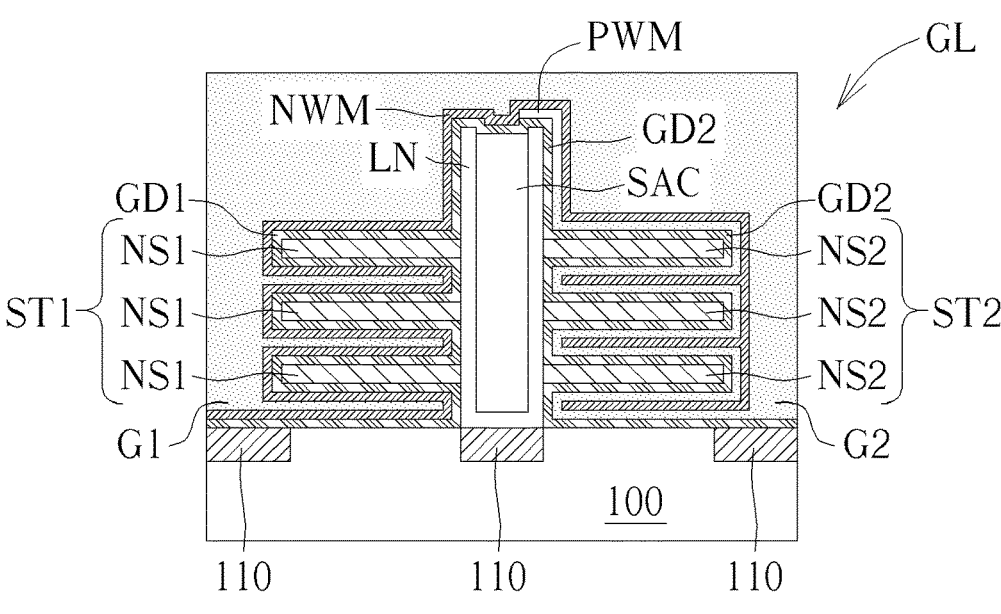
Figure 10:
Figure 10:
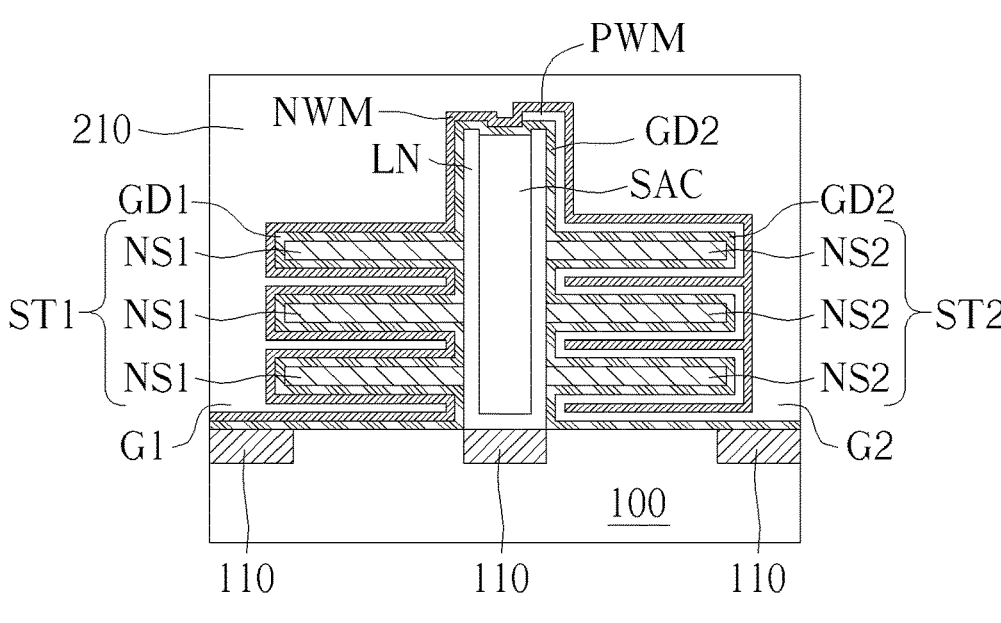

As shown in FIG. 8 to FIG. 10, the first transistor T1 is formed in the first device region R1, and the second transistor T2 is formed in the second device region R2. According to an embodiment of the present invention, the first device region R1 is, for example, an NMOS region, and the second device region R2 is, for example, a PMOS region. According to an embodiment of the present invention, the first transistor T1 is, for example, an NMOS transistor, and the second transistor T2 is, for example, a PMOS transistor.

According to an embodiment of the present invention, the first transistor T1 includes a first fin structure F1 on the substrate 100, wherein the first fin structure F1 includes a first source S1, a first drain D1, and a first channel CH1 extending along the first direction (for example, reference y-axis) between the first source S1 and the first drain D1. According to an embodiment of the present invention, the first transistor T1 further includes a gate G1 extending along the second direction (for example, the reference x-axis), covering the first fin structure F1.

According to an embodiment of the present invention, the second transistor T2 includes a second fin structure F2 on the substrate 100, wherein the second fin structure T2 includes a second source S2, a second drain D2, and a second channel CH2 extending along the first direction (for example, the reference y-axis) between the second source S2 and the second drain D2. According to an embodiment of the present invention, the second transistor T2 further includes a gate G2 extending along the second direction (for example, the reference x-axis), covering the second fin structure F2. According to an embodiment of the present invention, the gate G1 and the gate G2 may be metal gates.

According to an embodiment of the present invention, a work function layer may be formed on the first gate dielectric GD1 and the second gate dielectric GD2. For example, a P work function layer PWM may be formed on the second gate dielectric GD2 in the second device region R2. An N work function layer NWM may be formed on the first gate dielectric GD1 in the first device region R1 and on the P work function layer PWM in the second device region R2. At this point, the sacrificial layer SAC and the lining layer LN constitute a temporary dielectric wall DW between the first transistor T1 and the second transistor T2.

Figure 11:
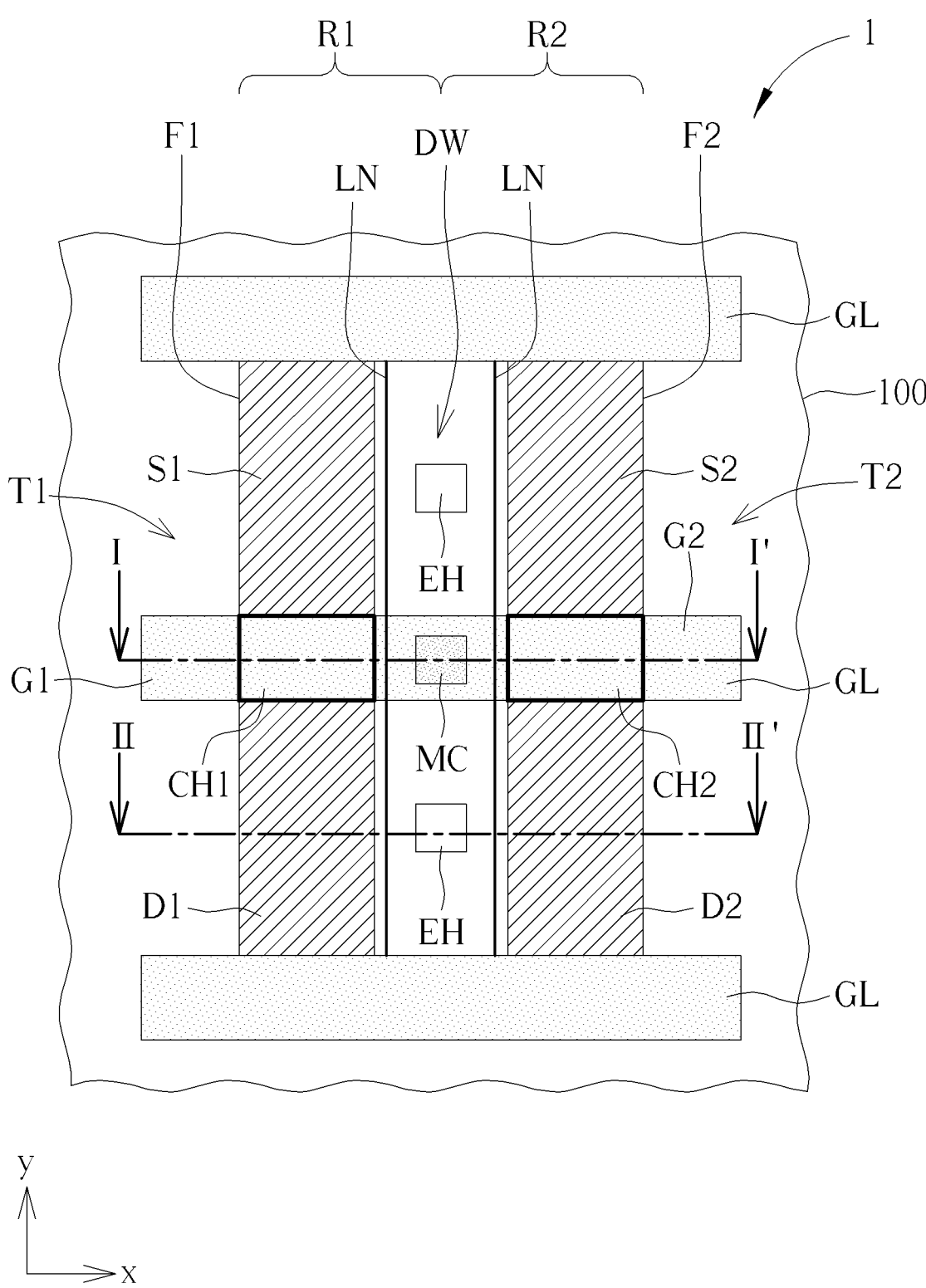
Figure 12:
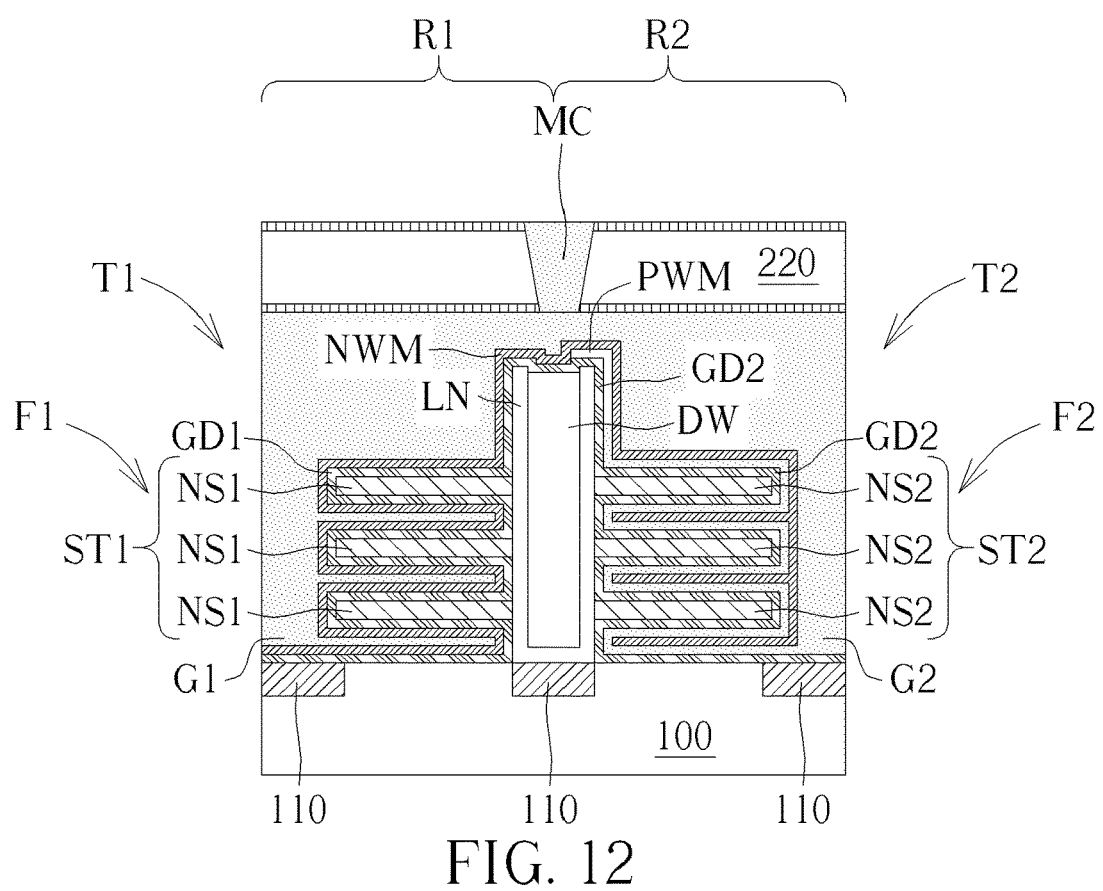
Figure 13:
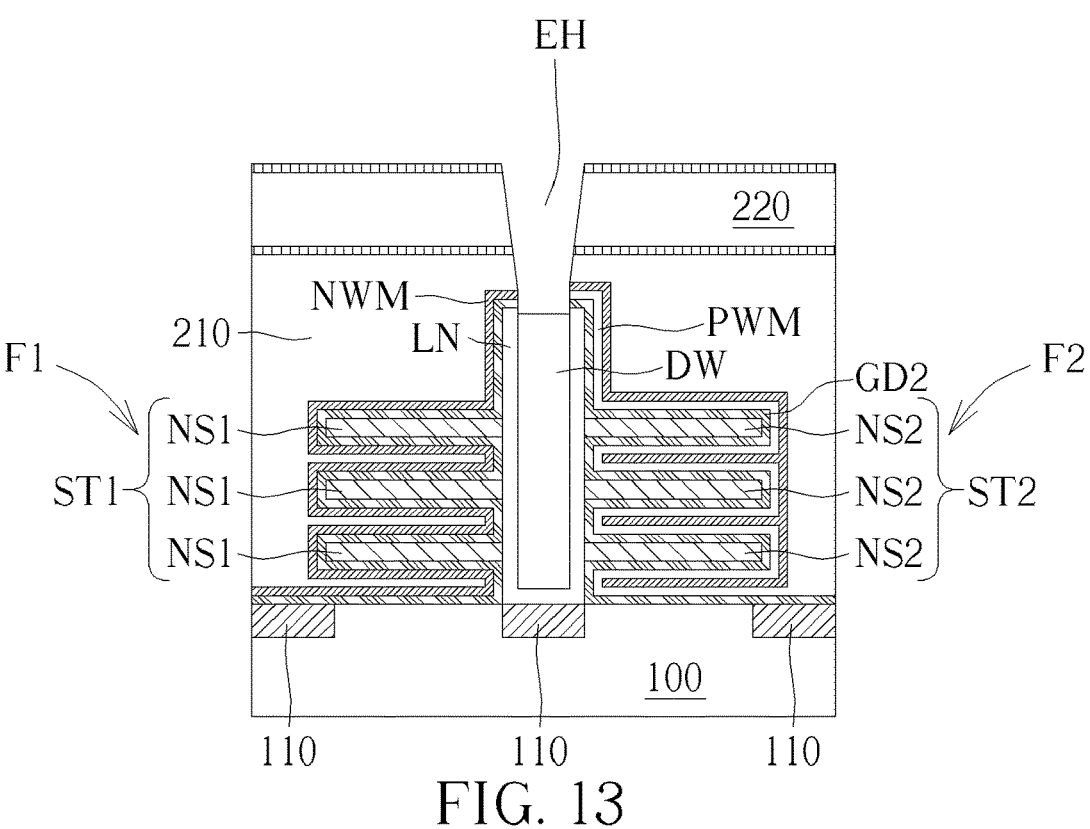

As shown in FIG. 11 to FIG. 13, after the fabrication of the first transistor T1 and the second transistor T2 is completed, a second interlayer dielectric layer 220 is deposited in the first device region R1 and the second device region R2, so that the second interlayer dielectric layer 220 covers the first interlayer dielectric layer 210, the gate G1 and the gate G2. According to an embodiment of the present invention, next, metal contacts MC are formed on the gate G1 and the gate G2 in the second interlayer dielectric layer 220. A contact hole EH is formed above the temporary dielectric wall DW between two adjacent gate lines GL in the second interlayer dielectric layer 220, so that the contact hole EH exposes a part of the top surface of the temporary dielectric wall DW.

Figure 14:
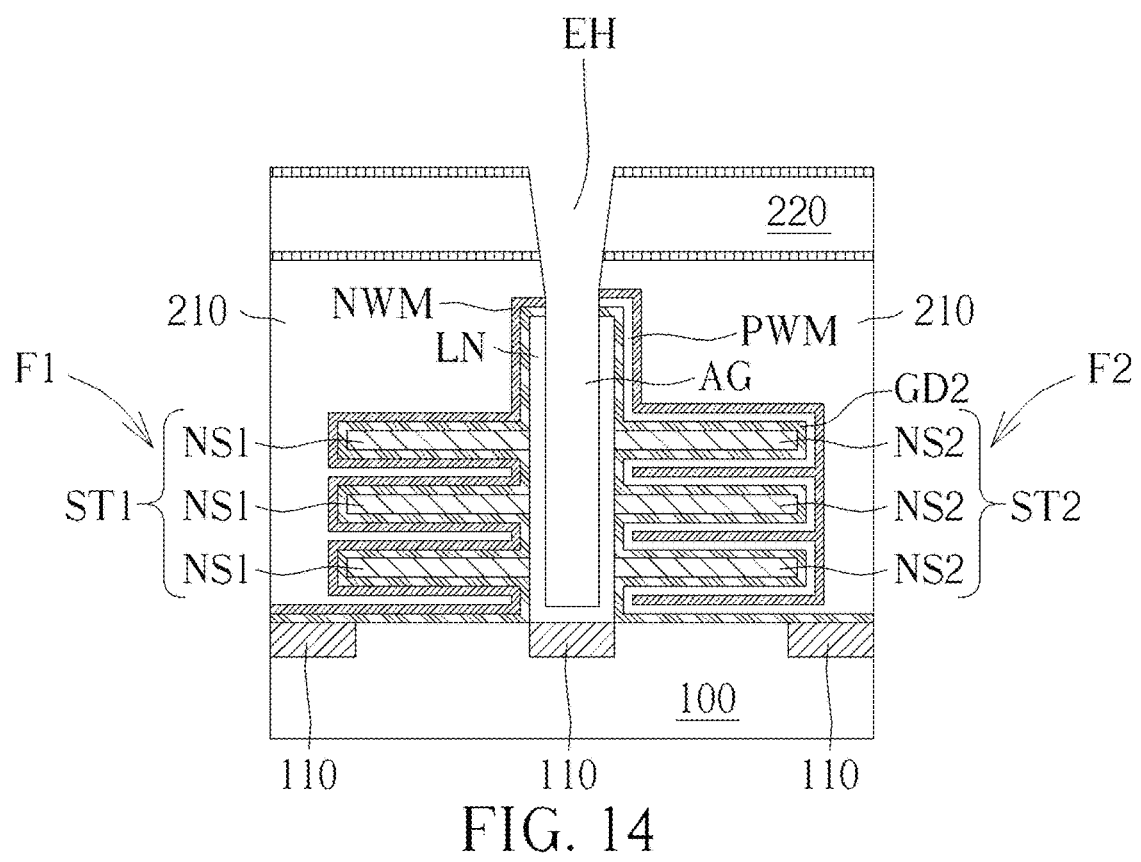

As shown in FIG. 14, a wet etching process is then performed and the temporary dielectric wall DW is removed through the contact hole EH, thereby forming an air gap AG between the first fin structure F1 and the second fin structure F2. The first fin structure F1 and the second fin structures F2 are separated from each other by the air gaps AG.

Figure 15:
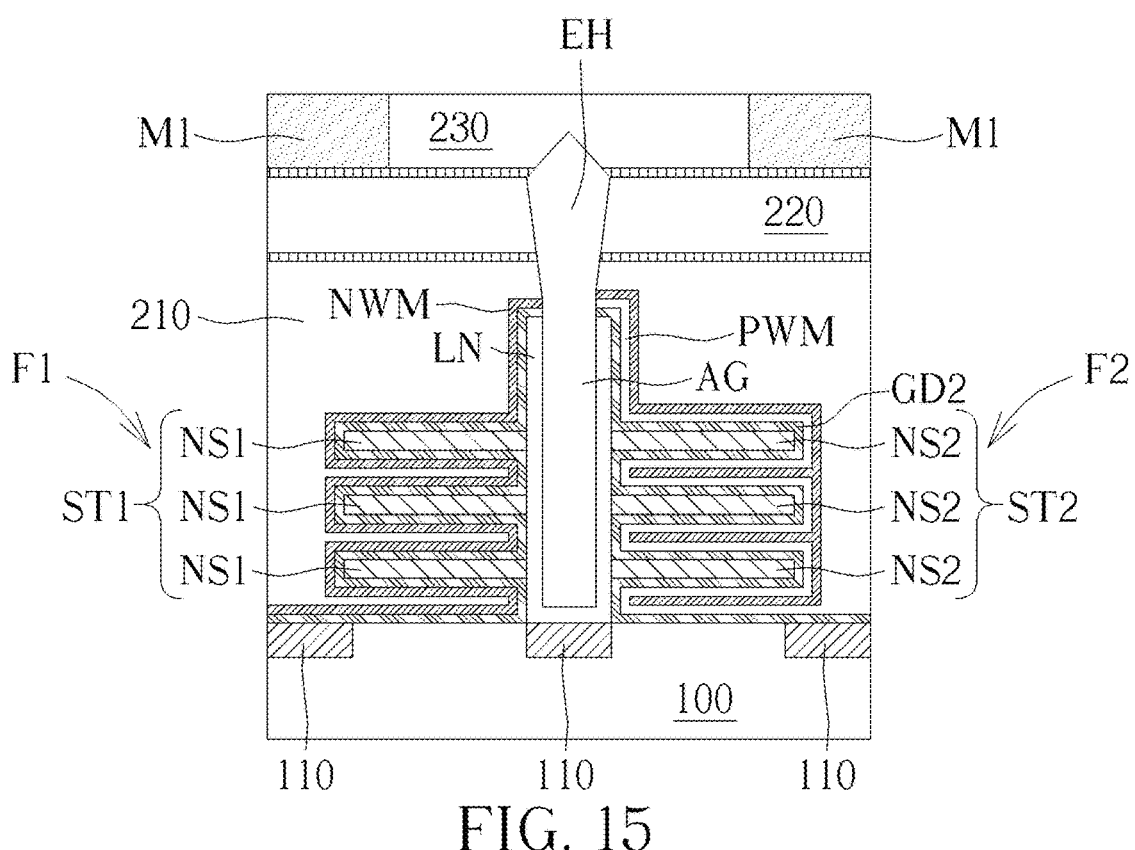

Finally, as shown in FIG. 15, a third interlayer dielectric layer 230 is deposited on the second interlayer dielectric layer 220. According to an embodiment of the present invention, a first metal wiring pattern M1 may be formed in the third interlayer dielectric layer 230. According to an embodiment of the present invention, the upper end of the contact hole EH is sealed by the third interlayer dielectric layer 230. According to an embodiment of the present invention, the air gap AG communicates with the sealed contact hole EH. The air gap AG can effectively reduce the parasitic capacitance and signal coupling between the first transistor T1 and the second transistor T2, so as to improve the operation performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate having a first device region and a second device region adjacent to the first device region;
a first transistor disposed in the first device region, the first transistor comprising a first fin structure on the substrate, wherein the first fin structure comprises a first source, a first drain, and a first channel extending between the first source and the first drain in a first direction; and
a second transistor disposed in the second device region and spaced apart from the first transistor in a second direction, the second transistor comprising a second fin structure on the substrate, wherein the second fin structure comprises a second source, a second drain, and a second channel extending between the second source and the second drain in the first direction, wherein the first fin structure and the second fin structure are separated one from the other by an air gap, and the air gap has a longitudinal axis parallel to the first direction, wherein the air gap has different heights along the first direction.

2. The semiconductor device according to claim 1, wherein the air gap is disposed along a boundary between the first device region and the second device region.

3. The semiconductor device according to claim 1, wherein the first device region is an NMOS region and the first transistor is an NMOS transistor.

4. The semiconductor device according to claim 3, wherein the second device region is a PMOS region and the second transistor is a PMOS transistor.

5. The semiconductor device according to claim 1, wherein the first fin structure comprises a first stack of nanosheets, wherein each of the nanosheets is surrounded by a first gate dielectric.

6. The semiconductor device according to claim 5, wherein the second fin structure comprises a second stack of nanosheets, wherein each of the nanosheets is surrounded by a second gate dielectric.

7. The semiconductor device according to claim 6, wherein each of the nanosheets is formed of a channel material.

8. The semiconductor device according to claim 1, wherein an interior surface of the air gap is covered with a lining layer.

9. The semiconductor device according to claim 8, wherein the lining layer is a silicon oxide layer.

10. The semiconductor device according to claim 1, wherein the air gap is disposed in a first interlayer dielectric layer, and wherein the air gap is communicated with a sealed contact hole that is disposed in a second interlayer dielectric layer above the first interlayer dielectric layer, and wherein the contact hole has a tapered sectional profile.

11. A method for forming semiconductor device, comprising:
providing a substrate having a first device region and a second device region adjacent to the first device region;
forming a first transistor in the first device region, the first transistor comprising a first fin structure on the substrate, wherein the first fin structure comprises a first source, a first drain, and a first channel extending between the first source and the first drain in a first direction;
forming a second transistor in the second device region and spaced apart from the first transistor in a second direction, the second transistor comprising a second fin structure on the substrate, wherein the second fin structure comprises a second source, a second drain, and a second channel extending between the second source and the second drain in the first direction; and
forming an air gap between the first fin structure and the second fin structure, wherein the first fin structure and the second fin structure are separated one from the other by the air gap, and the air gap has a longitudinal axis parallel to the first direction, wherein the air gap has different heights along the first direction.

12. The method according to claim 11, wherein the air gap is disposed along a boundary between the first device region and the second device region.

13. The method according to claim 11, wherein the first device region is an NMOS region and the first transistor is an NMOS transistor.

14. The method according to claim 13, wherein the second device region is a PMOS region and the second transistor is a PMOS transistor.

15. The method according to claim 11, wherein the first fin structure comprises a first stack of nanosheets, wherein each of the nanosheets is surrounded by a first gate dielectric.

16. The method according to claim 15, wherein the second fin structure comprises a second stack of nanosheets, wherein each of the nanosheets is surrounded by a second gate dielectric.

17. The method according to claim 16, wherein each of the nanosheets is formed of a channel material.

18. The method according to claim 11, wherein an interior surface of the air gap is covered with a lining layer.

19. The method according to claim 18, wherein the lining layer is a silicon oxide layer.

20. The method according to claim 11, wherein the air gap is disposed in a first interlayer dielectric layer, and wherein the air gap is communicated with a sealed contact hole that is disposed in a second interlayer dielectric layer above the first interlayer dielectric layer, and wherein the contact hole has a tapered sectional profile.

* * * * *